United States Patent
Tsai et al.

(10) Patent No.: US 10,818,353 B1
(45) Date of Patent: Oct. 27, 2020

(54) METHOD FOR RIPENING RESISTIVE RANDOM ACCESS MEMORY

(71) Applicant: Winbond Electronics Corp., Taichung (TW)

(72) Inventors: Tsung-Huan Tsai, Taichung (TW); Lih-Wei Lin, Taichung (TW); Wan-Ni Shih, Taichung (TW); Min-Yen Liu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/684,527

(22) Filed: Nov. 14, 2019

(51) Int. Cl.
*G11C 11/22* (2006.01)
*G11C 13/00* (2006.01)

(52) U.S. Cl.
CPC ........ *G11C 13/0069* (2013.01); *G11C 13/004* (2013.01); *G11C 13/0097* (2013.01)

(58) Field of Classification Search
CPC ............ G11C 13/0069; G11C 13/0004; G11C 13/0007; G11C 2213/79; G11C 2213/72
USPC ....................................... 365/145
See application file for complete search history.

(56) References Cited

U.S. PATENT DOCUMENTS

| 2015/0380086 A1 | 12/2015 | Park et al. |
| 2017/0243641 A1* | 8/2017 | Kim ................. G11C 13/0038 |
| 2019/0019551 A1* | 1/2019 | Lee ..................... G11C 11/5657 |

FOREIGN PATENT DOCUMENTS

CN          109427967          3/2019

OTHER PUBLICATIONS

"Office Action of Taiwan Counterpart Application", dated Apr. 7, 2020, p. 1-8.

* cited by examiner

Primary Examiner — Son T Dinh
(74) Attorney, Agent, or Firm — JCIPRNET

(57) ABSTRACT

The present disclosure provides a method for ripening a resistive random access memory (RRAM). The method includes: obtaining a first RRAM, wherein the first RRAM includes a plurality of memory cells; performing a forming operation and an initial reset operation on the first RRAM to form a plurality of specific memory cells in the memory cells; reading a specific number of the specific cells, and determining a ripening cycle parameter according to the specific number; and performing a ripening operation on the first RRAM based on the ripening cycle parameter to ripen the first RRAM as a second RRAM.

17 Claims, 2 Drawing Sheets

METHOD FOR RIPENING RESISTIVE RANDOM ACCESS MEMORY

TECHNICAL FIELD

The disclosure relates a manufacturing method of a resistive random access memory (RRAM), and more particularly, relates to a method for ripening resistive random access memory.

BACKGROUND

The RRAM is a nonvolatile memory, in which each RRAM unit includes a top electrode plate, a bottom electrode plate, a dielectric material layer interposed between the top and bottom electrode plates. The dielectric material layer is typically insulated, and a conductive path passing through the dielectric material layer (which is usually called a conductive filament (CF)) can be formed in the dielectric material layer by performing a forming operation on memory cells through a suitable voltage applied to the top electrode plate. Once the conductive filament is formed, a reset operation may be performed through an appropriate voltage applied to the top electrode plate (i.e., to cut off or break off a part of the conductive filament and cause a high resistance state (HRS) on the RRAM unit).

Then, a set operation may be performed on the RRAM unit through the suitable voltage applied on the top electrode plate again (i.e., to reform the conductive filament and cause a low resistance state (LRS) on the RRAM unit). By repeatedly performing the set operation and the reset operation, a resistance state (LRS or HRS) of the RRAM may be controlled. The LRS and the HRS may be used to indicate a digital signal of "0" or "1" to provide relevant memory functions.

Nonetheless, the RRAM has always had data retention concern. In general, formation of the LRS channel of the RRAM is easier to ripen, and more likely to pass related tests for reliability after the process development. However, for the HRS channel, because the arrangement of oxygen vacancy lattices can often change or diverge due to thermal energy, some oxygen vacancies cannot be connected so that the current is still maintained at high level. Moreover, since the design trend of RRAM in recent years tends to be a low-power design, it is an important issue for persons skilled in the art to design a mechanism capable of establishing a stable channel in the RRAM.

SUMMARY

Accordingly, the disclosure proposes a method for ripening resistive random access memory which can be used to solve the technical problems described above.

The disclosure provides a method for ripening resistive random access memory, including: obtaining a first resistive random access memory, wherein the first resistive random access memory includes a plurality of memory cells; performing a forming operation and an initial reset operation on the first resistive random access memory to form a plurality of specific memory cells in the memory cells, wherein a memory cell current of each of the specific memory cells is greater than a preset threshold; reading a specific number of the specific cells, and determining a ripening cycle parameter according to the specific number; and performing a ripening operation on the first resistive random access memory based on the ripening cycle parameter to ripen the first resistive random access memory as a second resistive random access memory.

Based on the above, the disclosure can obtain the specific number of the specific memory cells in the RRAM after the forming operation and the initial reset operation are performed, and adaptively determine the ripening cycle frequency of the ripening operation. Accordingly, the channel structure in each memory cell may become more stable to improve the performance of data retention for the RRAM.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
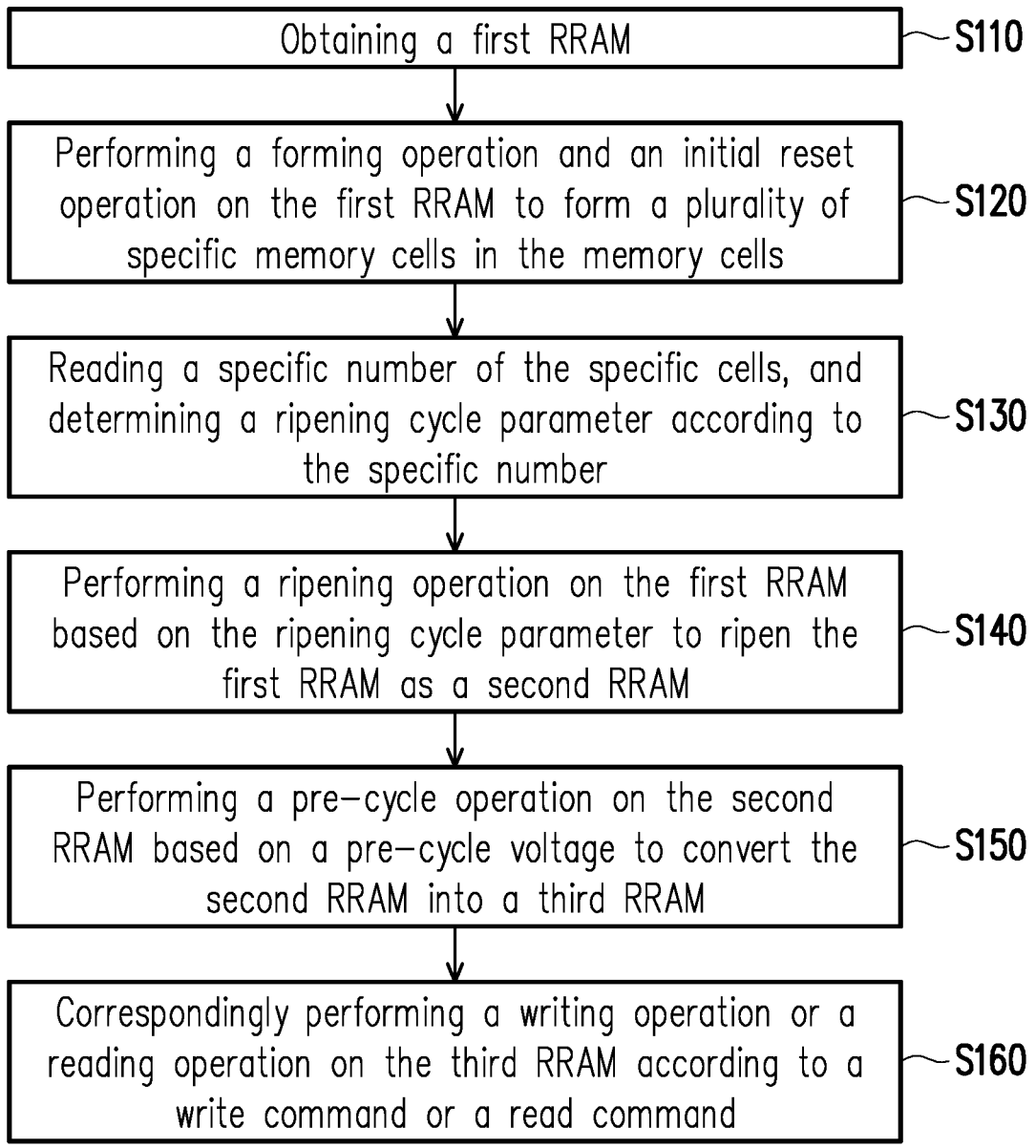
FIG. 1 is a flowchart illustrating a method for ripening RRAM according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Referring to FIG. 1, FIG. 1 is a flowchart illustrating a method for ripening RRAM according to an embodiment of the disclosure. First of all, in step S110, a first RRAM may be obtained. In this embodiment, the first RRAM is any RRAM not processed by a forming operation, a set operation and a reset operation, or any RRAM that can be used as an implementation target of the method of the disclosure. However, the disclosure is not limited in this regard. Further, the first RRAM may include a plurality of memory cells (or known as memory units), and a structure of each memory cell may refer to the RRAM unit previously mentioned, so the relevant details are not repeated hereinafter.

Next, in step S120, a forming operation and an initial reset operation may be performed on the first RRAM to form a plurality of specific memory cells in the memory cells. In an embodiment, after the forming operation and the initial reset operation are performed on the first RRAM, a memory cell current of each memory cell is measured and whether a memory cell circuit of each memory cell is fail is determined by, for example, determining whether the memory cell current of each memory cell is greater than a preset threshold (e.g., 3 µA). Then, one or more of the memory cells with the memory cell current greater than the preset threshold may be defined as the specific memory cells described above.

In an embodiment, if the memory cell current of one particular memory cell is not reduced to a low enough level in response to the initial reset operation, it means that the resistance state of that particular memory cell is not correspondingly switched to the HRS. Therefore, that particular memory cell (i.e., the specific memory cell) may also be referred as a fail bit.

Then, in step S130, a specific number of the specific cells may be read, and a ripening cycle parameter may be determined according to the specific number. In this embodiment, the specific number of the specific memory cells can be counted, and in the case where the specific memory cell may be referred to as the fail bit, the specific number may be correspondingly referred to as a fail bit count (FBC). However, the disclosure is not limited in this regard. In other words, the concept of obtaining the specific number described above may be interpreted as obtaining the FBC of the first RRAM (after the initial reset operation). However, the disclosure is not limited in this regard.

In an embodiment of the disclosure, the ripening cycle parameter may be positively correlated to the specific number. That is to say, if the number of the specific memory cells is larger, the ripening cycle parameter is higher.

In a first embodiment, the ripening cycle parameter may be expressed by a ripening cycle frequency. In this case, a specific ratio of the specific number to a total number of the memory cells in the first RRAM may be obtained first. This specific ratio may be interpreted as a portion of the specific memory cells in all the memory cells. Then, whether the specific ratio is greater than a first threshold (e.g., 80%) may be determined. If so, it means that a considerable number of the memory cells in the first RRAM are not successfully switched to the HRS so the ripening cycle frequency can be correspondingly set to a first value (e.g., 50 times).

On the other hand, if the specific ratio is not greater than the first threshold, whether the specific ratio is less than the first threshold and greater than a second threshold (e.g., 50%) may be determined. If so, it means that a certain number of the memory cells in the first RRAM are not successfully switched to the HRS so the ripening cycle frequency can be correspondingly set to a second value (e.g., 20 times) which is slightly less than the first value.

In another embodiment, if the specific ratio is not less than the first threshold and is greater than the second threshold, whether the specific ratio is less than the second threshold and greater than a third threshold (e.g., 20%) may be determined. If so, it means that most of the memory cells in the first RRAM are successfully switched to the HRS so the ripening cycle frequency can be correspondingly set to a third value (e.g., 0 times) which is slightly less than the second value.

Moreover, in a second embodiment, the ripening cycle parameter may also be expressed by a ripening voltage. In this case, a specific ratio of the specific number to a total number of the memory cells in the first RRAM may be obtained first. Then, whether the specific ratio is greater than a first threshold (e.g., 80%) may be determined. If so, it means that a considerable number of the memory cells in the first RRAM are not successfully switched to the HRS so the ripening voltage can be correspondingly set to a first voltage (e.g., with a value higher than 0.4V).

On the other hand, if the specific ratio is not greater than the first threshold, whether the specific ratio is less than the first threshold and greater than a second threshold (e.g., 50%) may be determined. If so, it means that a certain number of the memory cells in the first RRAM are not successfully switched to the HRS so the ripening voltage can be correspondingly set to a second voltage (e.g., with a value higher than 0.2V) which is slightly less than the first voltage.

In another embodiment, if the specific ratio is not less than the first threshold and is greater than the second threshold, whether the specific ratio is less than the second threshold and greater than a third threshold (e.g., 20%) may be determined. If so, it means that most of the memory cells in the first RRAM are successfully switched to the HRS so the ripening voltage can be correspondingly set to a third voltage (e.g., with a value higher than 0.1V) which is slightly less than the second voltage.

Next, in step S140, a ripening operation may be performed on the first RRAM based on the ripening cycle parameter to ripen the first RRAM as a second RRAM.

In the first embodiment, one ripening operation may sequentially include a set operation and a reset operation performed based on the ripening voltage (which may be collectively referred to as one pre-cycle). Here, the ripening voltage may adopt a voltage value higher than that of a normal operating voltage. That is to say, after the ripening cycle parameter (i.e., the ripening cycle frequency) is determined in step S130, the pre-cycle corresponding to the ripening cycle frequency may be performed on the first RRAM to ripen the first RRAM as the second RRAM. For instance, if the ripening cycle frequency is 50, the pre-cycle may be correspondingly performed 50 times on the first RRAM based on the ripening voltage. As another example, if the ripening cycle frequency is 20, the pre-cycle may be correspondingly performed 20 times on the first RRAM based on the ripening voltage, but the disclosure is not limited thereto.

In the second embodiment, after the ripening cycle parameter (i.e., the ripening voltage) is determined in step S130, the pre-cycle corresponding to a preset frequency may be performed on the first RRAM to ripen the first RRAM as the second RRAM. For instance, if the ripening voltage is 0.4V and the preset frequency is 10, the pre-cycle may be correspondingly performed 10 times on the first RRAM based on the ripening voltage with the value of 0.4V. As another example, if the ripening voltage is 0.2V and the preset frequency is 10, the pre-cycle may be correspondingly performed 10 times on the first RRAM based on the ripening voltage with the value of 0.2V, but the disclosure is not limited thereto.

As can be seen from the above, the disclosure can obtain the specific number of the specific memory cells in the RRAM after the forming operation and the initial reset operation are performed, and adaptively determine the ripening cycle parameter of the ripening operation. A higher ripening cycle parameter (e.g., a higher ripening voltage or a higher ripening cycle parameter) is adopted when the specific number is larger, or otherwise a lower ripening cycle parameter is adopted. Accordingly, the channel structure (i.e., the CF structure) in each memory cell may become more stable to improve the performance of data retention for the RRAM.

In addition, after step S140, step S150 may be continuously performed to perform a pre-cycle operation on the second RRAM based on a pre-cycle voltage to convert the second RRAM into a third RRAM. In this embodiment, the pre-cycle voltage may adopt a voltage value identical to that of the normal operating voltage, i.e., a voltage value less than that of the ripening voltage. In an embodiment, a difference between the ripening voltage and the pre-cycle voltage may be greater than 0.2V. In another embodiment, the ripening voltage may be greater than the pre-cycle voltage by up to 5%, but not limited thereto.

In an embodiment, the pre-cycle operation may, for example, sequentially include a set operation and a reset operation performed based on the pre-cycle voltage. That is to say, after the ripening operation corresponding to the ripening cycle frequency is performed on the first RRAM based on the higher ripening voltage to ripen the first RRAM as the second RRAM, the pre-cycle operation may be performed once on the second RRAM based on a lower ripening voltage to convert the second RRAM into the third RRAM.

Then, in step S160, a writing operation or a reading operation may be correspondingly performed on the third RRAM according to a write command or a read command. That is to say, after the third RRAM is obtained through step S110 to S150, the third RRAM may be used in normal writing or reading operations.

Figure 2:
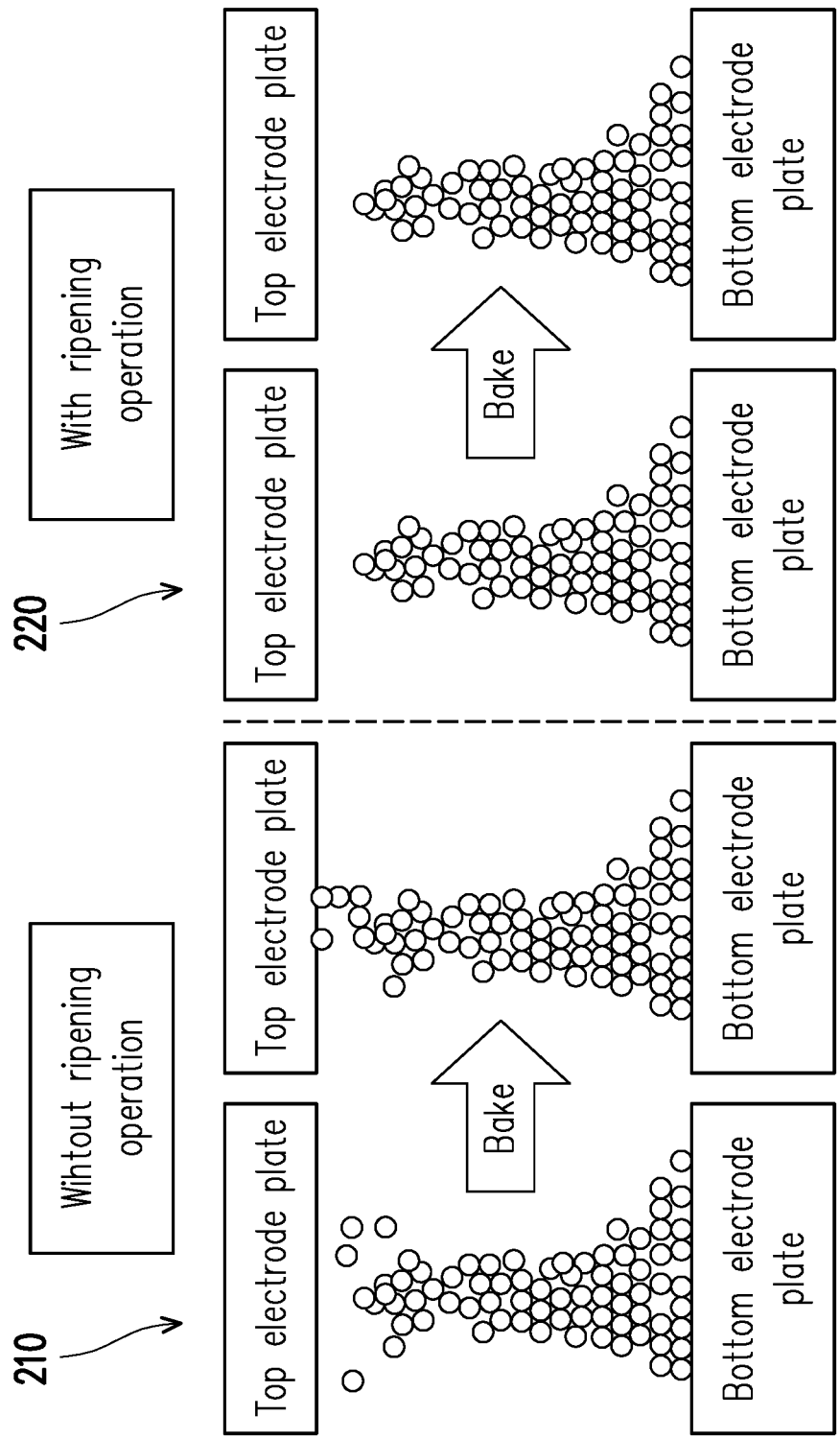
FIG. 2 is a schematic diagram illustrating memory cell structures formed with/without a ripening operation according to an embodiment of the disclosure.

In order to make the concept of the disclosure easier to understand, the following description is further provided with reference to FIG. 2. Referring to FIG. 2, FIG. 2 is a schematic diagram illustrating memory cell structures formed with/without a ripening operation according to an embodiment of the disclosure.

In this embodiment, it is assumed that a memory 210 is not processed by the ripening operation proposed by the disclosure and a memory cell 220 is processed by the ripening operation proposed by the disclosure. As can be seen from FIG. 2, after the memory cell 210 is baked, because the oxygen vacancy lattices (illustrated as circles) are loosely distributed in the CF, a relatively fragile CF structure is formed. In this case, the CF in the memory cell 210 is more likely to cause the oxygen vacancy lattices to be easily moved due to thermal energy, thereby increasing the possibility that the CF is cut off. Therefore, the memory cell 210 will perform poorly in the high temperature data retention (HTDR).

On the other hand, as can be seen from FIG. 2, after the memory cell 220 is baked, because the oxygen vacancy lattices (illustrated as circles) are closely distributed in the CF, a relatively robust CF structure is formed. In this case, the CF in the memory cell 220 is less likely to cause the oxygen vacancy lattices to be easily moved due to thermal energy, thereby decreasing the possibility that the CF is cut off. Therefore, the memory cell 220 will perform preferably in the HTDR.

In summary, the disclosure can obtain the specific number (e.g., the FBC) of the specific memory cells in the RRAM after the forming operation and the initial reset operation are performed, and adaptively determine the ripening cycle frequency (which may be positively correlated to the FBC, for example) of the ripening operation. Accordingly, the channel structure in each memory cell may become more stable to improve the performance of data retention for the RRAM.

Further, because the ripening cycle frequency may be appropriately determined according to the specific number of the specific memory cells, the RRAM with the more preferable CF structure may be produced with better efficiency. In addition, since the method of the disclosure is simple and easy to design, it is suitable for designing self-detection and repair processes of the RRAM in a RRAM chip. Those processes will not affect the repined memory cells or the performance of subsequent writing/reading operations.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A method for ripening resistive random access memory, comprising:

obtaining a first resistive random access memory, wherein the first resistive random access memory comprises a plurality of memory cells;

performing a forming operation and an initial reset operation on the first resistive random access memory to form a plurality of specific memory cells in the memory cells, wherein a memory cell current of each of the specific memory cells is greater than a preset threshold;

reading a specific number of the specific cells, and determining a ripening cycle parameter according to the specific number; and performing a ripening operation on the first resistive random access memory based on the ripening cycle parameter to ripen the first resistive random access memory as a second resistive random access memory.

2. The method according to claim 1, wherein the ripening cycle parameter is a ripening cycle frequency, and the step of performing the ripening operation on the first resistive random access memory based on the ripening cycle parameter comprises:

performing the ripening operation corresponding to the ripening cycle frequency on the first resistive random access memory based on a ripening voltage.

3. The method according to claim 2, further comprising:

performing a pre-cycle operation on the second resistive random access memory based on a pre-cycle voltage to convert the second resistive random access memory into a third resistive random access memory.

4. The method according to claim 2, wherein the ripening operation sequentially includes a set operation and a reset operation performed based on the ripening voltage.

5. The method according to claim 3, wherein the ripening voltage is greater than the pre-cycle voltage.

6. The method according to claim 3, wherein a difference between the pre-cycle voltage and the ripening voltage is greater than 0.2V.

7. The method according to claim 3, wherein the ripening voltage is greater than the pre-cycle voltage by up to 5%.

8. The method according to claim 3, wherein the pre-cycle operation sequentially includes a set operation and a reset operation performed based on the pre-cycle voltage.

9. The method according to claim 2, wherein the step of determining the ripening cycle parameter according to the specific number comprises:

obtaining a specific ratio of the specific number to a total number of the memory cells;

in response to the specific ratio greater than a first threshold, setting the ripening cycle frequency to a first value; and in response to the specific ratio less than the first threshold and greater than a second threshold, setting the ripening cycle frequency to a second value, wherein the first value is greater than the second value.

10. The method according to claim 9, further comprising:

in response to the specific ratio less than the second threshold and greater than a third threshold, setting the ripening cycle frequency to a third value, wherein the third value is less than the second value.

11. The method according to claim 3, further comprising:

correspondingly performing a writing operation or a reading operation on the third resistive random access memory according to a write command or a read command.

12. The method according to claim 1, wherein the ripening cycle parameter is a ripening voltage, and the step of performing the ripening operation on the first resistive random access memory based on the ripening cycle parameter comprises:

performing the ripening operation corresponding to a preset frequency on the first resistive random access memory based on the ripening voltage.

13. The method according to claim 12, wherein the step of determining the ripening cycle parameter according to the specific number comprises:

obtaining a specific ratio of the specific number to a total number of the memory cells;

in response to the specific ratio greater than a first threshold, setting the ripening voltage to a first voltage; and in response to the specific ratio less than the first threshold and greater than a second threshold, setting the ripening voltage to a second voltage, wherein the first voltage is greater than the second voltage.

14. The method according to claim 13, further comprising:

in response to the specific ratio less than the second threshold and greater than a third threshold, setting the ripening voltage to a third voltage, wherein the third voltage is less than the second voltage.

15. The method according to claim 13, further comprising:

performing a pre-cycle operation on the second resistive random access memory based on a pre-cycle voltage to convert the second resistive random access memory into a third resistive random access memory.

16. The method according to claim 15, further comprising:

correspondingly performing a writing operation or a reading operation on the third resistive random access memory according to a write command or a read command.

17. The method according to claim 1, wherein the ripening cycle parameter is positively correlated to the specific number.

* * * * *